(12) United States Patent
Mallik et al.

(10) Patent No.: US 11,735,533 B2
(45) Date of Patent: Aug. 22, 2023

(54) HETEROGENEOUS NESTED INTERPOSER PACKAGE FOR IC CHIPS

(71) Applicant: Intel Corporation, Santa Clara, CA (US)

(72) Inventors: Debendra Mallik, Chandler, AZ (US); Ravindranath Mahajan, Chandler, AZ (US); Robert Sankman, Phoenix, AZ (US); Shawna Liff, Scottsdale, AZ (US); Srinivas Pietambaram, Chandler, AZ (US); Bharat Penmecha, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 808 days.

(21) Appl. No.: 16/437,254

(22) Filed: Jun. 11, 2019

(65) Prior Publication Data

US 2020/0395313 A1  Dec. 17, 2020

(51) Int. Cl.
*H01L 23/00* (2006.01)
*H01L 21/48* (2006.01)
(Continued)

(52) U.S. Cl.
CPC .......... *H01L 23/562* (2013.01); *H01L 21/486* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5381* (2013.01);
(Continued)

(58) Field of Classification Search
CPC .............. H01L 23/562; H01L 21/4853; H01L 21/4857; H01L 21/486; H01L 21/565; H01L 21/568; H01L 23/3128; H01L 23/5381; H01L 23/5384; H01L 23/5385;
(Continued)

(56) References Cited

U.S. PATENT DOCUMENTS 10,163,798 B1 * 12/2018 Alur ........................ H01L 24/16
2014/0035131 A1 * 2/2014 Noh ........................ H01L 24/03
257/737

(Continued)

FOREIGN PATENT DOCUMENTS

DE    102014116417    6/2015
WO    WO 2016/179159   11/2016

OTHER PUBLICATIONS

Search Report from European Patent Application No. 20162143.0, dated Sep. 29, 2020, 7 pgs.
(Continued)

*Primary Examiner* — Matthew E. Gordon
(74) *Attorney, Agent, or Firm* — Schwabe, Williamson & Wyatt, P.C.

(57) ABSTRACT

Embodiments disclosed herein include electronic packages and methods of fabricating electronic packages. In an embodiment, an electronic package comprises an interposer, where a cavity passes through the interposer, and a nested component in the cavity. In an embodiment, the electronic package further comprises a die coupled to the interposer by a first interconnect and coupled to the nested component by (Continued)

a second interconnect. In an embodiment, the first and second interconnects comprise a first bump, a bump pad over the first bump, and a second bump over the bump pad.

22 Claims, 15 Drawing Sheets

(51) Int. Cl.
H01L 21/56 (2006.01)
H01L 23/31 (2006.01)
H01L 23/538 (2006.01)

(52) U.S. Cl.
CPC ...... *H01L 23/5384* (2013.01); *H01L 23/5385* (2013.01); *H01L 23/5386* (2013.01); *H01L 24/16* (2013.01); *H01L 2224/16227* (2013.01); *H01L 2924/3511* (2013.01)

(58) Field of Classification Search
CPC ............... H01L 23/5386; H01L 24/16; H01L 2224/16227; H01L 2924/3511
USPC ............................................. 257/668
See application file for complete search history.

(56) References Cited

U.S. PATENT DOCUMENTS

| | | | |
|---|---|---|---|
| 2014/0117552 A1* | 5/2014 | Qian | H01L 23/5383 257/E23.141 |
| 2014/0332966 A1* | 11/2014 | Xiu | H01L 23/293 257/773 |
| 2015/0116965 A1* | 4/2015 | Kim | H01L 23/5385 361/767 |
| 2016/0071818 A1* | 3/2016 | Wang | H01L 24/49 257/773 |
| 2018/0102311 A1 | 4/2018 | Shih | |
| 2020/0058627 A1* | 2/2020 | Chen | H01L 23/3135 |
| 2022/0352107 A1* | 11/2022 | Shim | H01L 24/13 |

OTHER PUBLICATIONS

Search Report from European Patent Application No. 22217054.0, dated Apr. 17, 2023, 9 pgs.

* cited by examiner

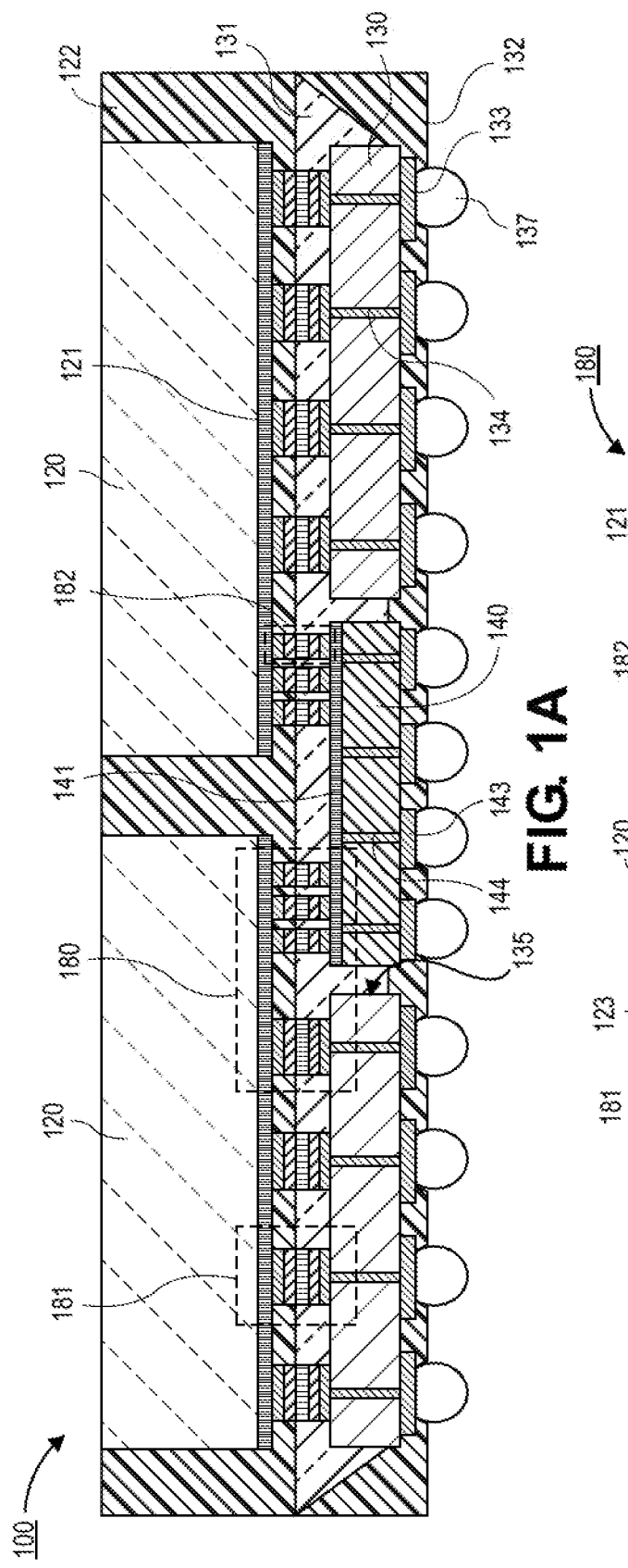
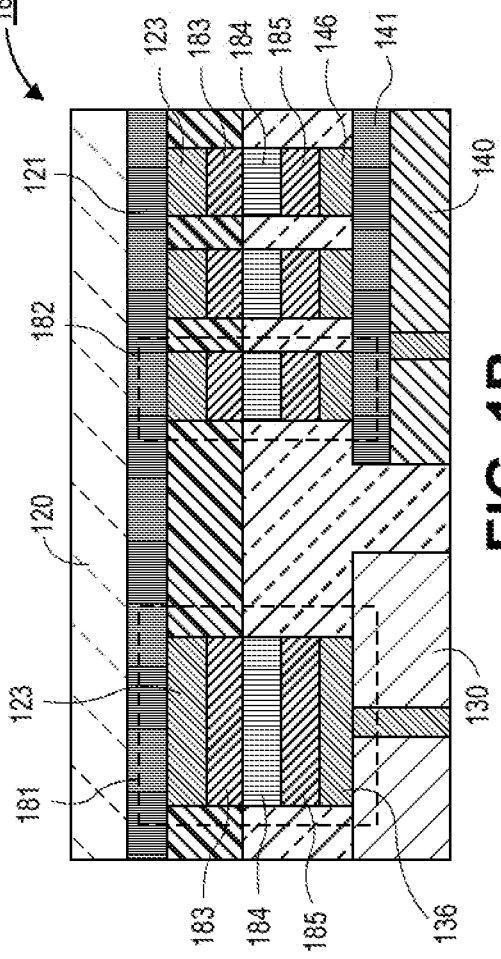
FIG. 1A
FIG. 1B

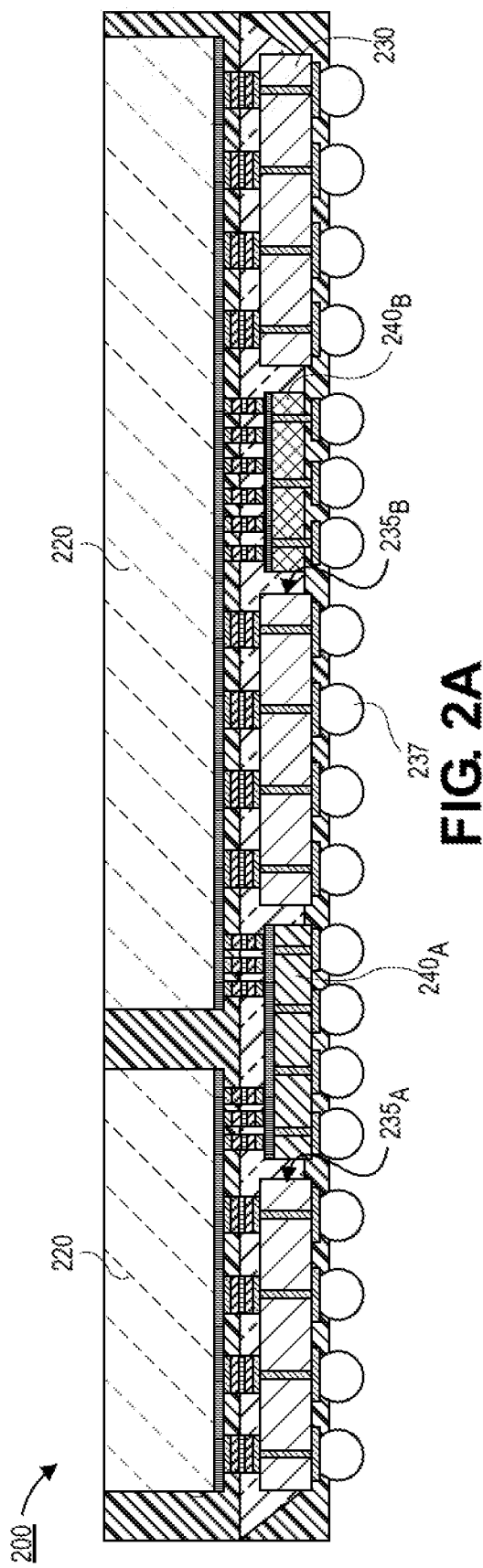
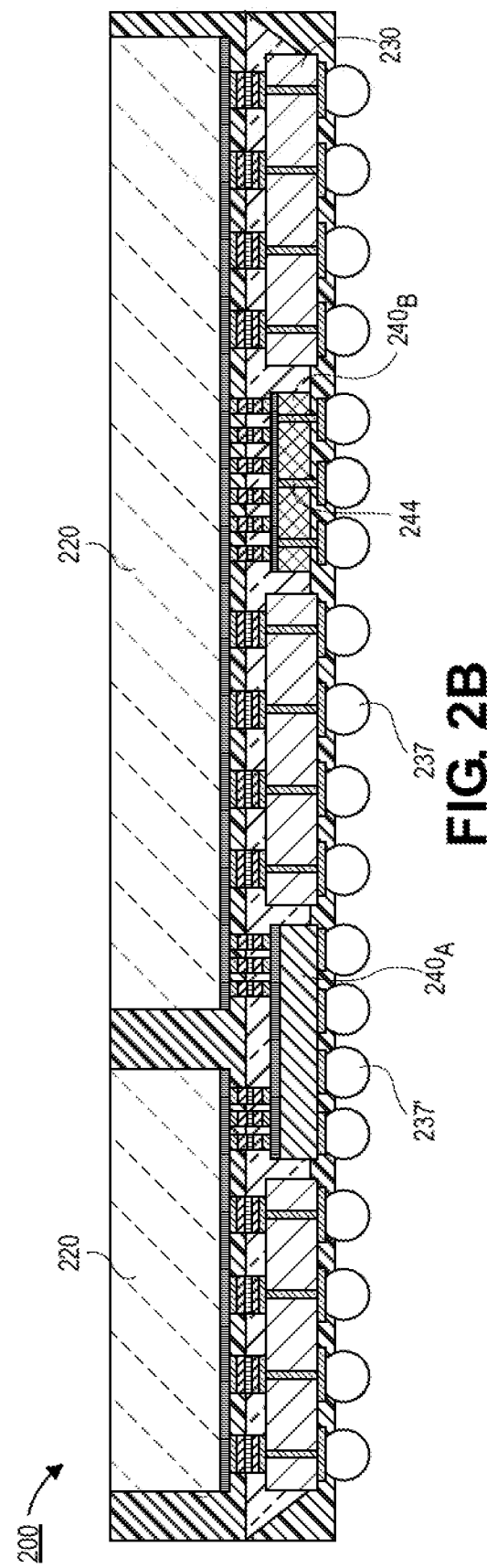
FIG. 2A
FIG. 2B

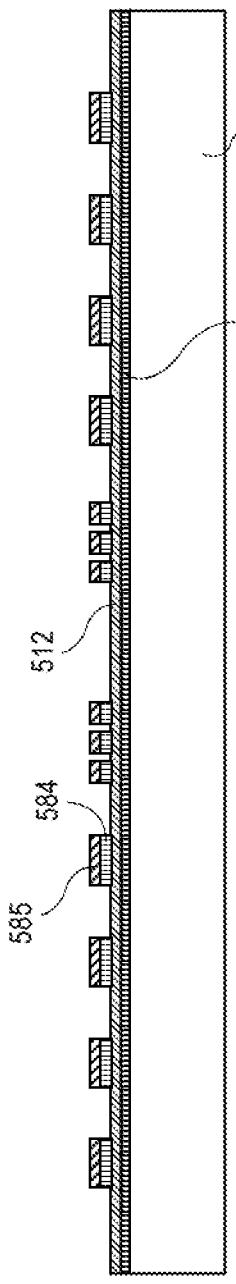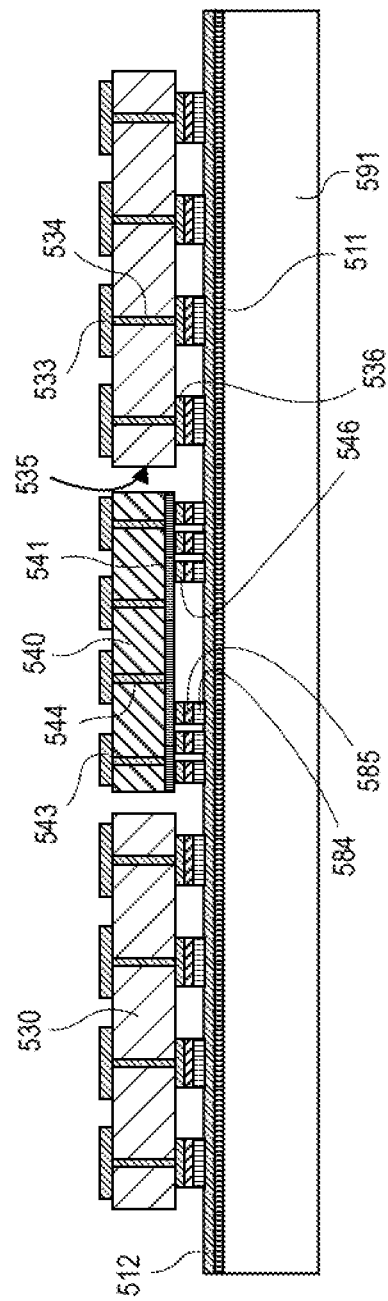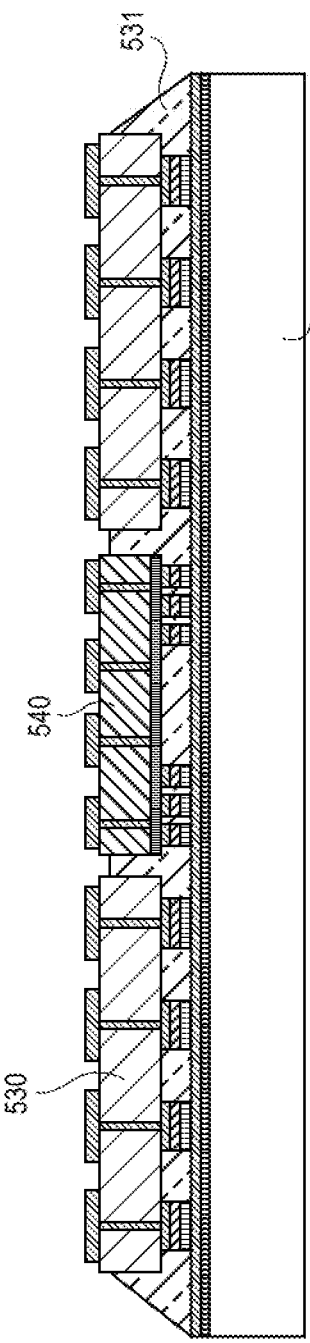

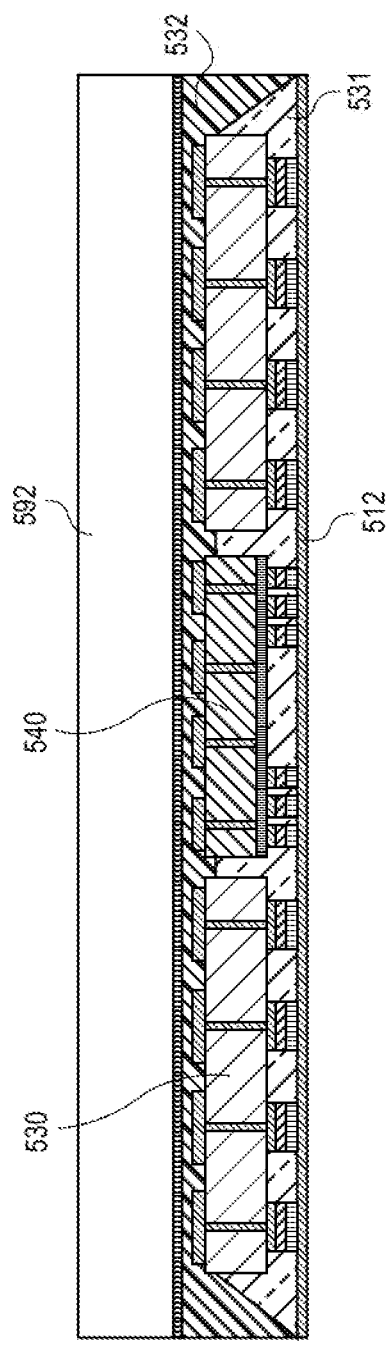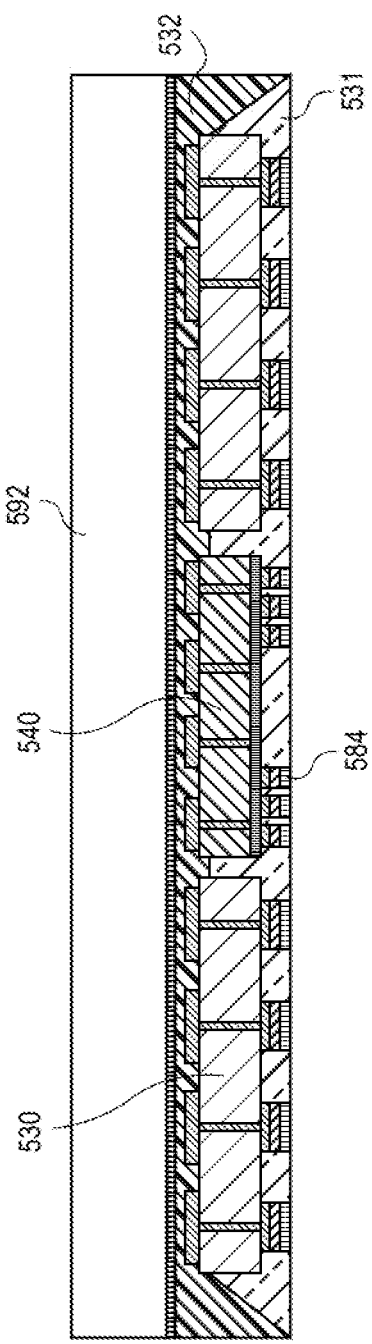

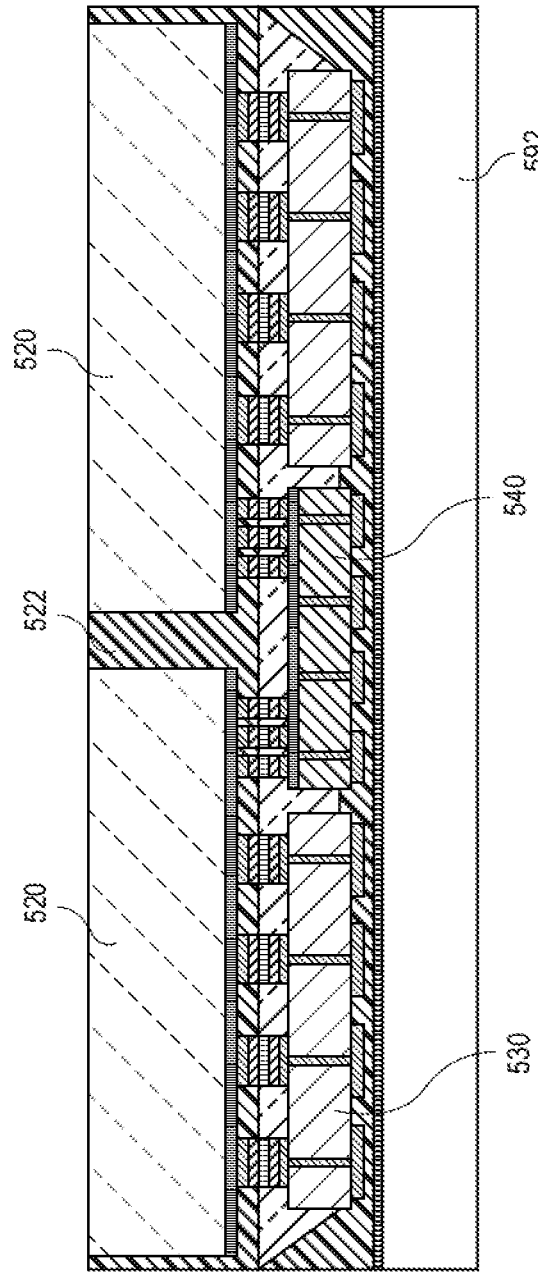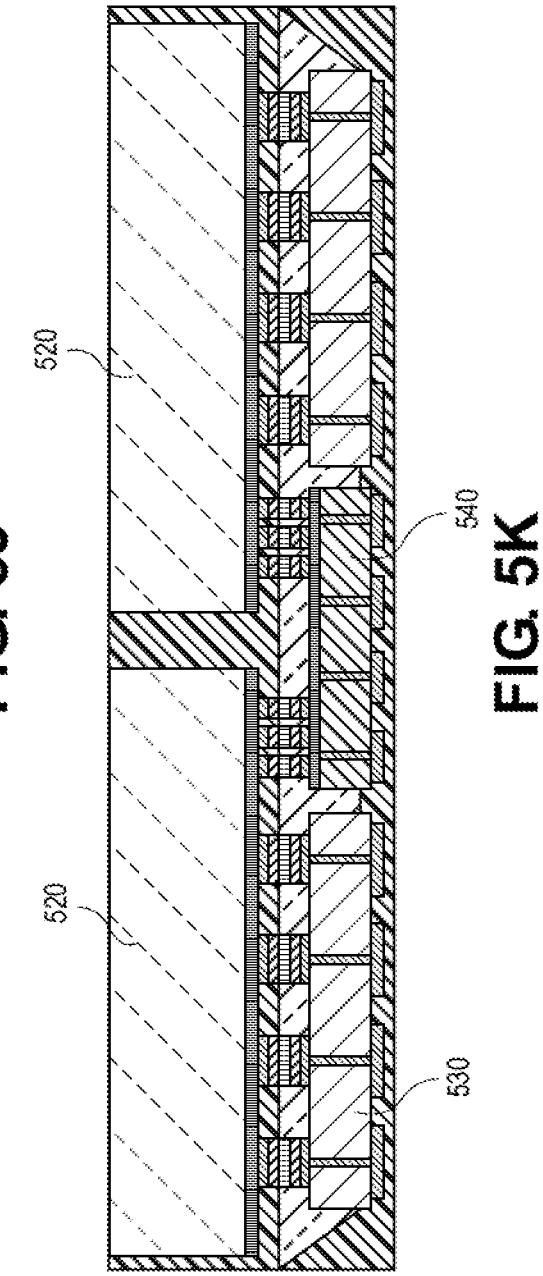

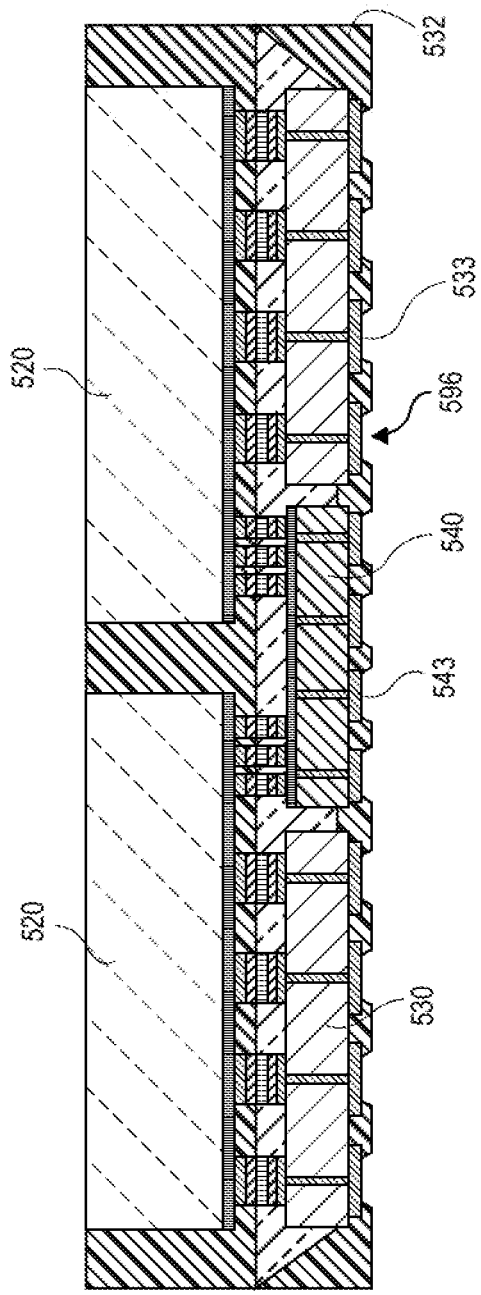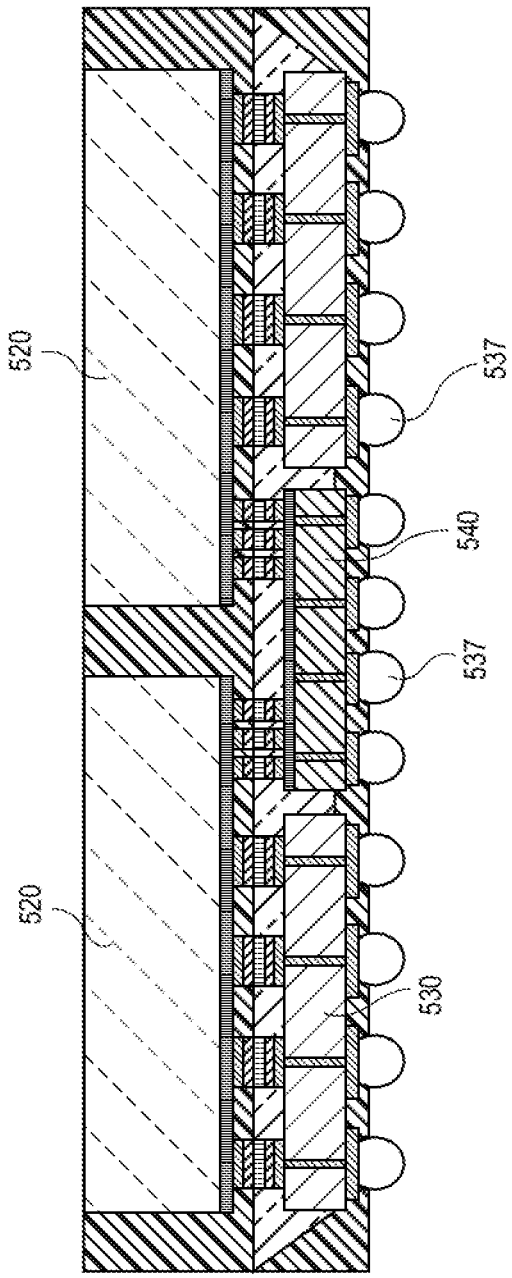

HETEROGENEOUS NESTED INTERPOSER PACKAGE FOR IC CHIPS

TECHNICAL FIELD

Embodiments of the present disclosure relate to electronic packaging, and more particularly, to multi-chip packaging architectures with one or more dies attached to an interposer and one or more components embedded in cavities in the interposer.

BACKGROUND

The demand for increased performance and reduced form factor are driving packaging architectures towards multi-chip integration architectures. Multi-chip integration allows for dies manufactured at different process nodes to be implemented into a single electronic package. However, current multi-chip architectures result in larger form factors that are not suitable for some use cases, or are not otherwise desirable to end users.

BRIEF DESCRIPTION OF THE DRAWINGS

FIG. 1A is a cross-sectional illustration of an electronic package that comprises a heterogeneous nested interposer, in accordance with an embodiment.

FIG. 1B is a zoomed in portion of FIG. 1A that more clearly illustrates the interconnects between the die and the interposer and the die and a nested component, in accordance with an embodiment.

FIG. 2A is a cross-sectional illustration of an electronic package with a heterogeneous nested interposer that comprises a plurality of nested components, in accordance with an embodiment.

FIG. 2B is a cross-sectional illustration of an electronic package with a heterogeneous nested interposer that comprises at least one nested component that does not include through component vias, in accordance with an embodiment.

FIG. 5A is a cross-sectional illustration of a plurality of bump pads disposed over a carrier, in accordance with an embodiment.

FIG. 5B is a cross-sectional illustration after an interposer and a nested component are attached to the bump pads, in accordance with an embodiment.

FIG. 5C is a cross-sectional illustration after an underfill is disposed around the interposer and the nested component, in accordance with an embodiment.

FIG. 5F is a cross-sectional illustration after the first carrier is removed, in accordance with an embodiment.

FIG. 5G is a cross-sectional illustration after the bump pads are exposed, in accordance with an embodiment.

FIG. 5J is a cross-sectional illustration after a mold layer is disposed around the dies, in accordance with an embodiment.

FIG. 5K is a cross-sectional illustration after the second carrier is removed, in accordance with an embodiment.

FIG. 5L is a cross-sectional illustration after openings are made through the mold layer to expose pads of the nested component and the interposer, in accordance with an embodiment.

FIG. 5M is a cross-sectional illustration after package side bumps are disposed in the openings, in accordance with an embodiment.

EMBODIMENTS OF THE PRESENT DISCLOSURE

Figure 2C:
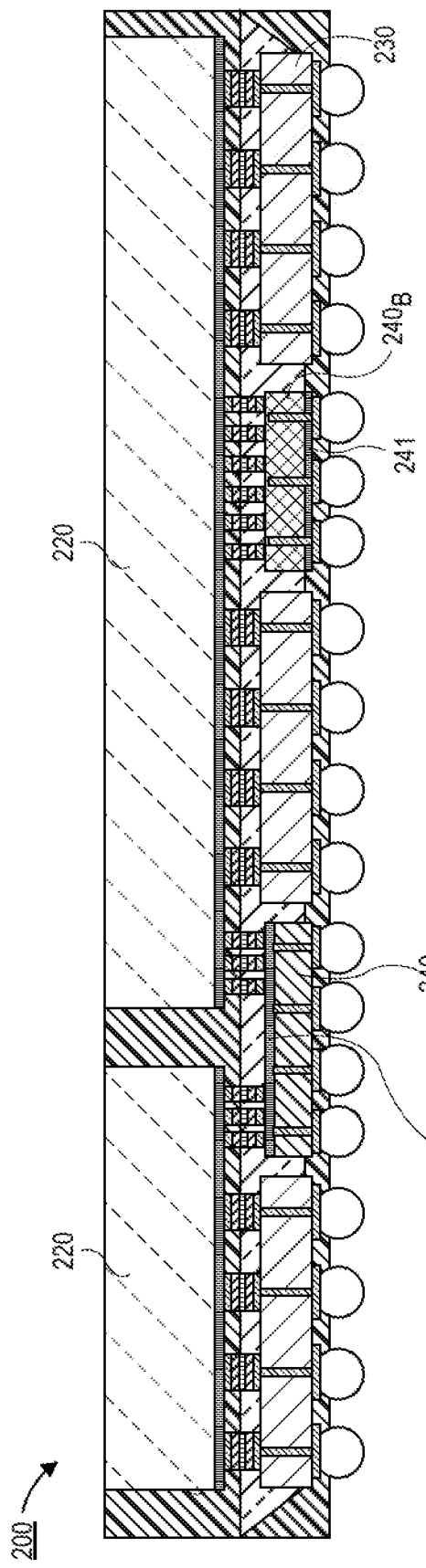
FIG. 2C is a cross-sectional illustration of an electronic package with a heterogeneous nested interposer that comprises at least one nested component that faces away from the die in the electronic package, in accordance with an embodiment.

Described herein are multi-chip packaging architectures with a heterogeneous nested interposer package and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current packaging solutions are beginning to use multi-die architectures. However, the inclusion of multiple dies in a single package is not without issue. In addition to the larger footprint of existing multi-die architectures, such systems also suffer from poor yield and reliability. Particularly, the interconnections between dies is difficult due to warpage and other alignment issues when using traditional packaging substrates. Accordingly, embodiments disclosed herein include electronic packages that utilize heterogeneous nested interposers.

Heterogeneous nested interposers, such as those described herein, include an interposer with one or more cavities. Nested components may be positioned in the cavities. One or more dies may be connected to the interposer and the nested components with interconnects. In an embodiment, the interconnects include a bump pad that interfaces with bumps (e.g., solder bumps) above and below. The use of a bump pad allows for self-aligning between the interposer or nested components and the die. Accordingly, embodiments allow for high yields and reliability, even when fine pitched interconnects are used (e.g., when the nested component is a bridge between two dies).

Referring now to FIG. 1A, a cross-sectional illustration of an electronic package 100 is shown, in accordance with an embodiment. In an embodiment, the electronic package 100 may comprise an interposer 130 and a nested component 140. The nested component 140 is positioned within a cavity 135 that passes through the interposer 130. The nested component 140 is referred to as being "nested" because the component 140 is placed into the cavity 135. That is, the nested component 140 is surrounded by portions of the interposer 130. In the illustrated embodiment, a single cavity 135 is shown in the interposer 130. However, it is to be appreciated that any number of cavities 135 may be used, depending on the device. Examples of multiple cavities 135 are provided below in greater detail. In the illustrated embodiment, a single nested component 140 in the cavity 135 is shown. However, it is to be appreciated that any number of nested components 140 may be positioned in a single cavity 135. Examples of multiple nested components 140 in a single cavity 135 is provided below in greater detail.

In an embodiment, the interposer 130 may be any suitable substrate material. For example, the interposer 130 may comprise glass, ceramic, semiconductor materials (e.g., high or low resistivity silicon, III-V semiconductors, or the like), organic substrates (high density interconnect (HDI) substrates, embedded trace substrates (ETS), high density package (HDP) substrates, molded substrates, or the like). In some embodiments, the interposer 130 is a passive device. That is, the interposer 130 may include only passive components (e.g., traces, vias, etc.). For example, the interposer 130 may comprise vias 134 that provide connections between pads 133 below the interposer 130 and pads 136 above the interposer 130. In other embodiments, the interposer 130 may be an active interposer. That is, the interposer 130 may comprise active devices (e.g., transistors etc.).

In an embodiment, the nested component 140 may be an active or passive component. For example, an active nested component 140 may comprise logic devices, analog/RF devices, I/O circuits, memory devices, voltage regulators, sensors, or the like. Passive nested components 140 may comprise high density multi-die interconnect bridge dies, capacitors, inductors, resistors, thermo-electric coolers, high speed connectors, or the like. In the illustrated embodiment, the nested component 140 comprises an active surface 141. While referred to as an "active" surface 141, it is to be appreciated that the active surface 141 may comprise entirely passive features. In an embodiment, the nested component 140 may comprise through component vias (TCVs) 144. The TCVs 144 may electrically couple the active surface 141 to pads 143 on the backside of the nested component 140.

In an embodiment, the interposer 130 and the nested component 140 may be embedded by an underfill material 131 and/or a mold layer 132. In an embodiment, pads 133 of the interposer 130 and pads 143 of the nested component 140 may be contacted by bumps 137 positioned in openings through a portion of the mold layer 132. In an embodiment, the bumps 137 may be referred to as "package side bumps" (PSBs). The PSBs may interface with a package substrate (not shown).

In an embodiment, the electronic package 100 may further comprise one or more dies 120 embedded in a mold layer 122. In an embodiment, the active surfaces 121 of the dies 120 may be electrically coupled to the interposer 130 and the nested component 140. For example, interconnects 181 provide electrical connections between the die 120 and the interposer 130, and interconnects 182 provide electrical connections between the die 120 and the nested component 140. In an embodiment, the interconnects 181 may have a different pitch than the interconnects 182. For example, the interconnects 182 may have a smaller pitch than the interconnects 181. In the illustrated embodiment, the nested component 140 is a bridge that provides an electrical connection between the two dies 120.

Referring now to FIG. 1B, a zoomed in portion 180 of the electronic package 100 is shown, in accordance with an embodiment. Portion 180 illustrates more clearly the architecture of the interconnects 181 and 182. As shown, the interconnects 181 and 182 are substantially similar to each other, with the exception that the widths of the interconnects 182 are smaller than the width of interconnects 181. In an embodiment, the interconnects comprise a bump pad 184. The bump pad 184 may be a conductive material, such as copper. Bumps 183 may be positioned over the bump pad 184, and bumps 185 may be positioned below the bump pad 184. The bumps 183, 185 may be solder bumps or the like. In an embodiment, the bumps 183 may interface with pads 123 of the die 120. The bumps 185 may interface with pads 136 of the interposer 130 or with pads 146 of the nested component 140.

The use of a bump pad 184 improves alignment between the dies 120 and the interposer 130 and between the dies 120 and the nested component 140. This is because the die 120 is self-aligned to the bump pads 184 by solder bumps 183, and the interposer 130 and the nested component 140 are self-aligned to the bump pads 184 by solder bumps 185. That is, the bump pads 184 provide locations to which all of the components are self-aligned. Since the dies 120, the interposer 130, and the nested component 140 are self-aligned to the same features, the dies 120 are precisely aligned to the interposer 130 and the nested component 140.

Referring now to FIG. 2A, a cross-sectional illustration of an electronic package 200 is shown, in accordance with an additional embodiment. In an embodiment, the electronic package 200 may be substantially similar to the electronic package 100 in FIG. 1A, with the exception that a plurality of nested components 240 are provided in the interposer 230. As shown, a first nested component 240A is positioned in a first cavity 235A in the interposer 230 and a second nested component 240B is positioned in a second cavity 235B. In an embodiment, the first cavity 235A may span between two dies 220. That is, the first cavity may be partially within a footprint of both dies 220. Accordingly, the first nested component 240A may be accessible by both dies 220. For example, the first nested component 240A may be a bridge that electrically couples the dies 220 together. In an embodiment, the second cavity 235B may be entirely within a footprint of one of the dies 220. In such embodiments, the second nested component 240B may be accessible to only one of the dies 220.

Referring now to FIG. 2B, a cross-sectional illustration of an electronic package 200 is shown, in accordance with an additional embodiment. In an embodiment, the electronic package 200 in FIG. 2B may be substantially similar to the electronic package 200 in FIG. 2A, with the exception that the first nested component 240A does not include TCVs 244. In some embodiments, the first nested component 240A may comprise dummy balls 237'. That is, in some embodiments the dummy balls 237' may not be electrically connected to circuitry of the package 200 and serve as mechanical supports only, whereas balls 237 provide mechanical support and are electrically connected to circuitry of the package 200. In such an embodiment, the nested component 240A may source power or signals from the package substrate (not shown) indirectly through the dies 220 via the top-side of the nested component 240A.

Referring now to FIG. 2C, a cross-sectional illustration of an electronic package 200 is shown, in accordance with an embodiment. In an embodiment, the electronic package 200 in FIG. 2C may be substantially similar to the electronic package 200 in FIG. 2A, with the exception that the second nested component 240B is facing a different direction. For example, the second nested component 240B may have an active surface 241 that is facing away from the die 220.

Figure 2D:
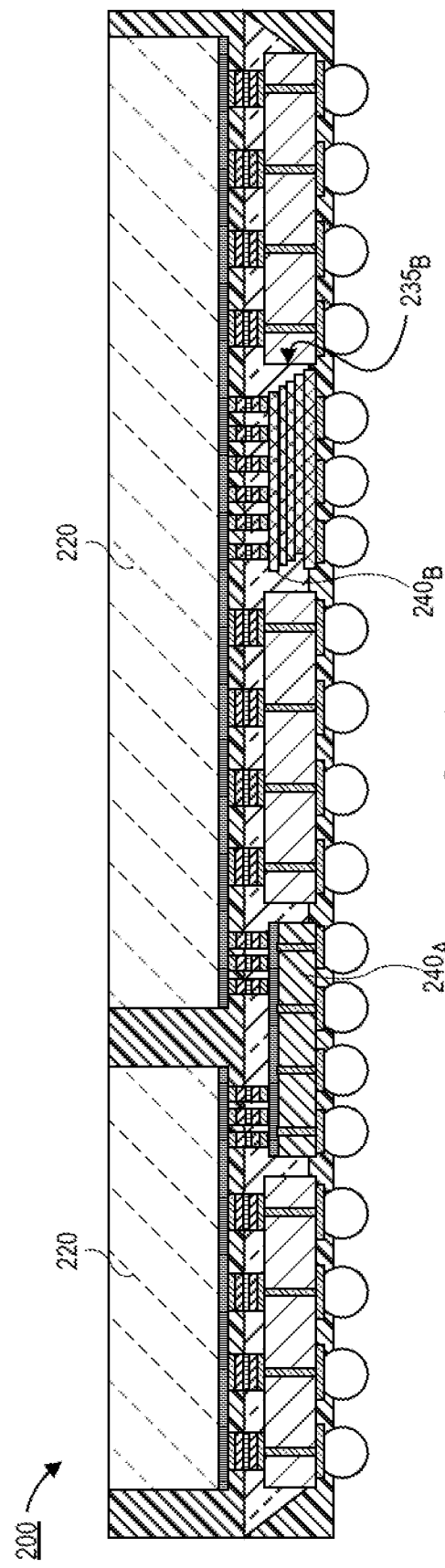
FIG. 2D is a cross-sectional illustration of an electronic package with a heterogeneous nested interposer that comprises a plurality of stacked components in a cavity, in accordance with an embodiment.

Referring now to FIG. 2D, a cross-sectional illustration of an electronic package 200 is shown, in accordance with an additional embodiment. In an embodiment, the electronic package 200 in FIG. 2C may be substantially similar to the electronic package 200 in FIG. 2A, with the exception that a stack of second nested components 240B is positioned in the second cavity 235B. In an embodiment, the stack of second nested components 240B may comprise a stack of memory dies or any other stackable components.

Figure 2E:
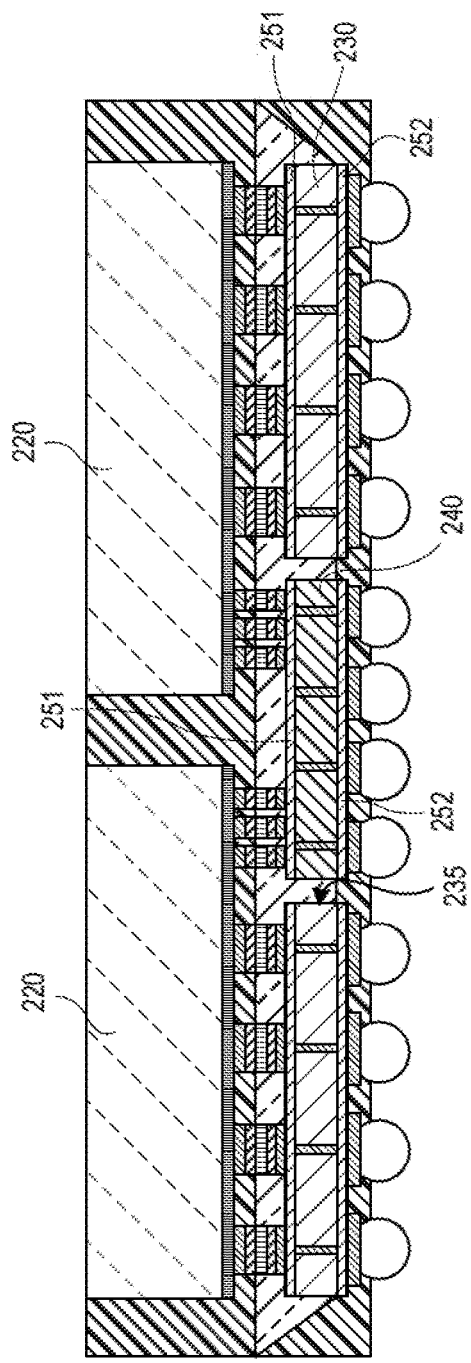
FIG. 2E is a cross-sectional illustration of an electronic package with a heterogeneous nested interposer that comprises a redistribution layer over the interposer and the nested component, in accordance with an embodiment.

Referring now to FIG. 2E, a cross-sectional illustration of an electronic package 200 is shown, in accordance with an embodiment. In an embodiment, the electronic package 200 may comprise an interposer 230, a nested component 240 in a cavity 235 in the interposer 230, and one or more dies 220 attached to the nested component 240 and the interposer 230. In an embodiment, the nested component 240 and/or the interposer 230 may comprise one or more redistribution layers 251, 252. For example, a redistribution layer 251 may be above the nested component 240 and the interposer 230 (i.e., facing the dies 220) and a redistribution layer 252 may be below the nested component 240 and the interposer 230. While the redistribution layers 251, 252 are shown on both the nested component 240 and the interposer 230, it is to be appreciated that in some embodiments, the redistribution layers 251, 252 may only be on one of the nested component 240 and the interposer 230. Additionally, while the redistribution layers 251, 252 are shown on both the top and bottom surfaces of the nested component 240 and the interposer 230, it is to be appreciated that in some embodiments, the redistribution layer 251 or 252 may be only on one surface of the nested component 240 and/or the interposer 230.

Figure 2F:
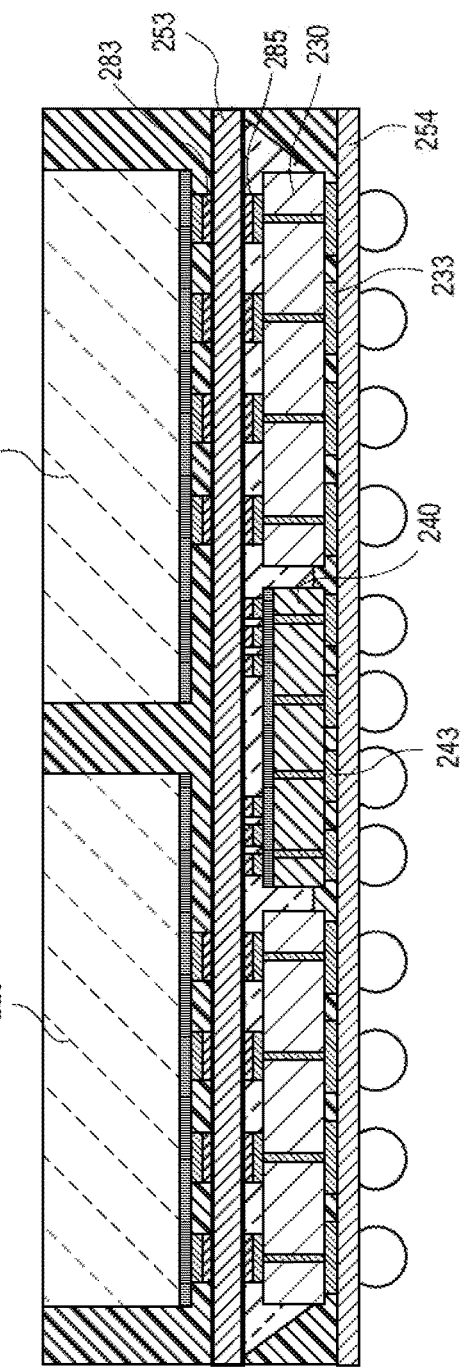
FIG. 2F is a cross-sectional illustration of an electronic package with a heterogeneous nested interposer that comprises a redistribution layer, in accordance with an embodiment.

Referring now to FIG. 2F, a cross-sectional illustration of an electronic package 200 is shown, in accordance with an additional embodiment. In an embodiment, the electronic package 200 may be substantially similar to the electronic package 200 in FIG. 2E, with the exception that the redistribution layers 253 and 254 are positioned in different locations. For example, a redistribution layer 253 may be located between the bumps 285 and the bumps 283 and/or a redistribution layer 254 may be located below the pads 233 of the interposer 230 and the pads 243 of the nested component 240. In the case where a redistribution layer 253 is located between bumps 285 and 283, it is to be appreciated that the bump pad may be integrated into the redistribution layer 254. While a redistribution layer 253 and 254 is shown in both locations in FIG. 2F, it is to be appreciated that only one redistribution layer 253 or 254 may be used in some embodiments. In FIGS. 2E and 2F, various redistribution layers 251-254 are shown. However, it is to be appreciated that embodiments may include any number or combination of redistribution layers 251-254 or redistribution layers in other locations not illustrated in FIGS. 2E and 2F.

Figure 3A:
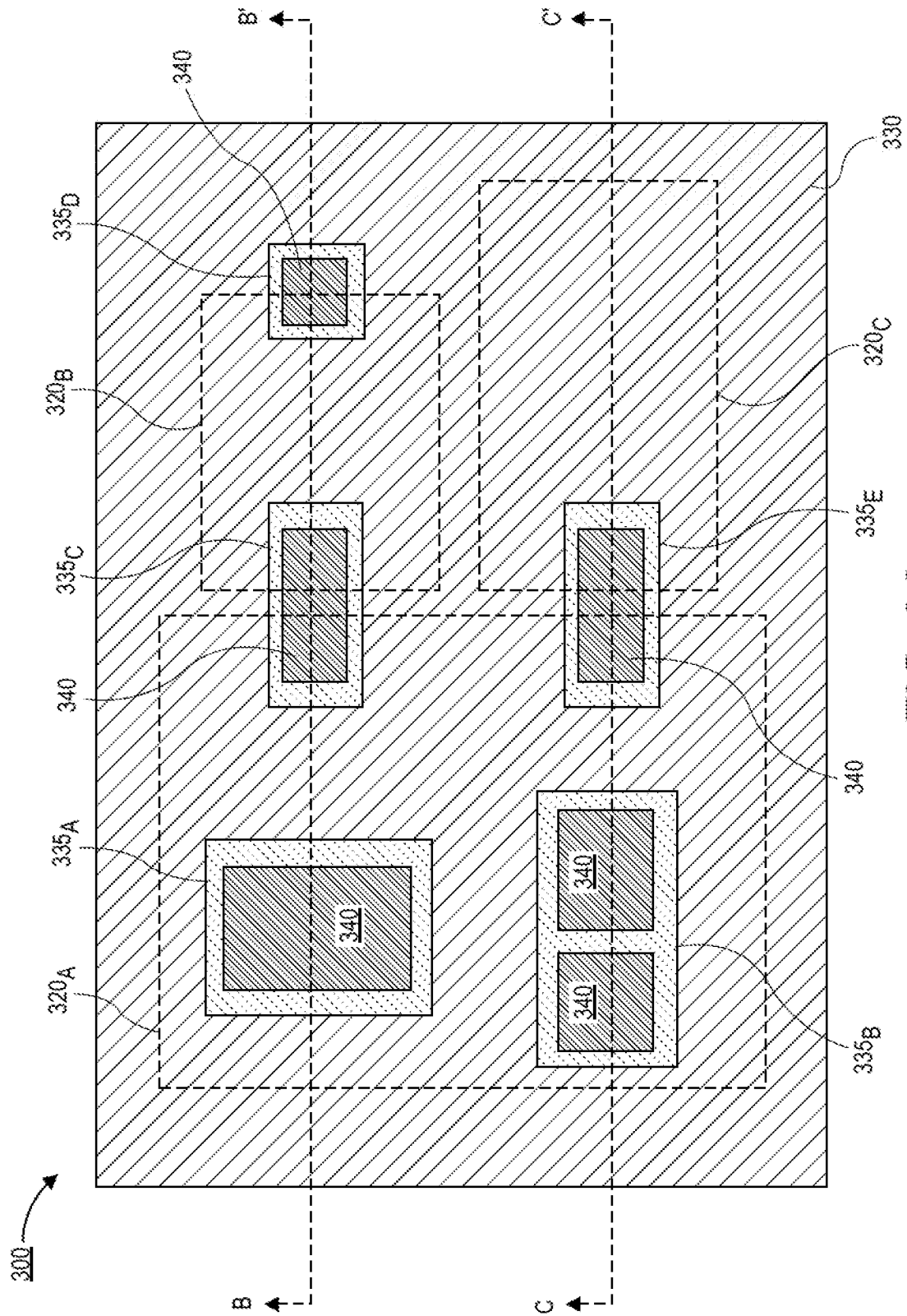
FIG. 3A is a plan view illustration of an electronic package with a heterogeneous nested interposer, in accordance with an embodiment.

Referring now to FIG. 3A, a plan view illustration of an electronic package 300 is shown, in accordance with an embodiment. In an embodiment, the electronic package 300 comprises an interposer 330 with a plurality of cavities $335_{A-E}$. In an embodiment, a plurality of nested components 340 are positioned in the cavities 335. In some embodiments, at least one of the cavities 335 comprises a plurality of nested components 340. For example, two nested components 340 are positioned in cavity $335_B$. In an embodiment, the cavities 335 may be entirely within a footprint of a die 320 (indicated by dashed lines), within the footprint of more than one die 320, and/or partially within the footprint of a single die 320. For example, cavities $335_A$ and $335_B$ are entirely within a footprint of die $320_A$, cavity $335_C$ is within the footprint of die $320_A$ and $320_B$, cavity $335_E$ is within the footprint of die $320_A$ and $320_C$, and cavity $335_D$ is partially within the footprint of die $320_B$.

Figure 3B:
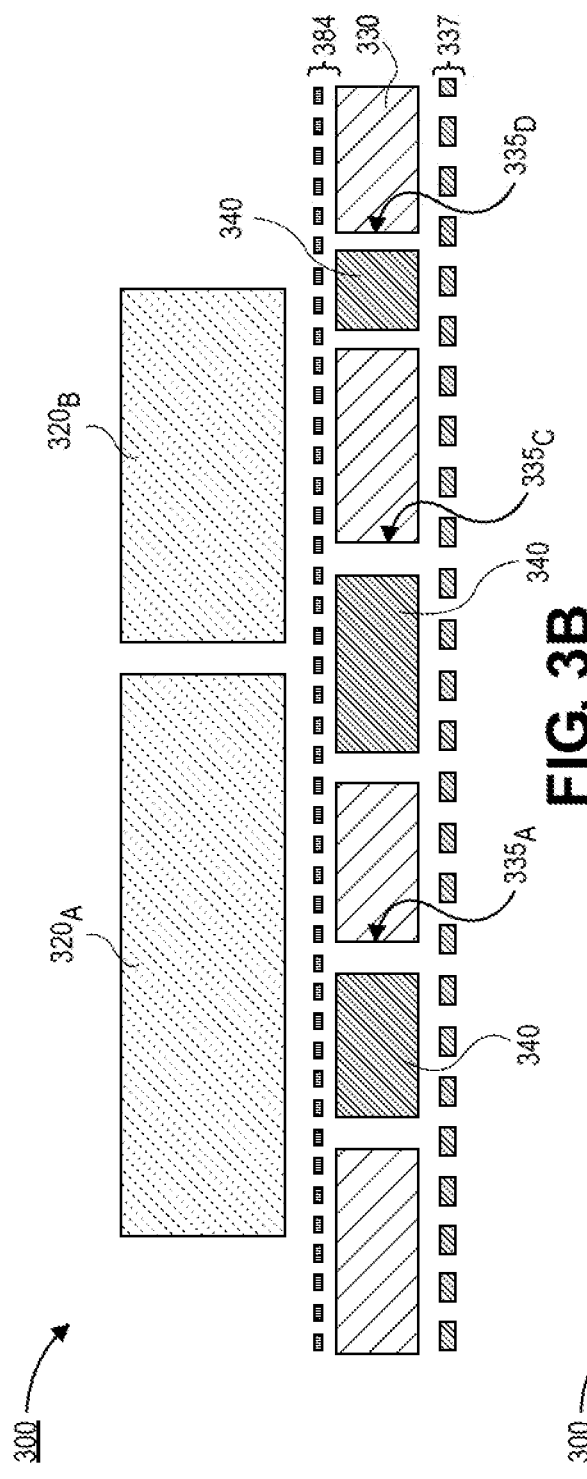
FIG. 3B is a cross-sectional illustration of the electronic package in FIG. 3A along line B-B', in accordance with an embodiment.

Referring now to FIG. 3B, a cross-sectional schematic illustration of the electronic package 300 in FIG. 3A along line B-B' is shown, in accordance with an embodiment. In the illustrated embodiment, the interposer 330 is shown with nested components 340 within cavities 335A, 335c, and 335. The interposer 330 and the nested components 340 may be electrically coupled to the dies 320A and 320B by interconnects that comprise a layer of bump pads 384. The bump pads 384 are shown schematically between the dies 320A, 320B and the interposer 330 and the nested components 340 for simplicity. However, it is to be appreciated that the bump pads 384 may be part of an interconnect substantially similar to the interconnects 181 and 182 described above with respect to FIG. 1B. In an embodiment, the bottom surfaces of the interposer 330 and the nested components 340 may be electrically coupled to package side bumps 337.

Figure 3C:
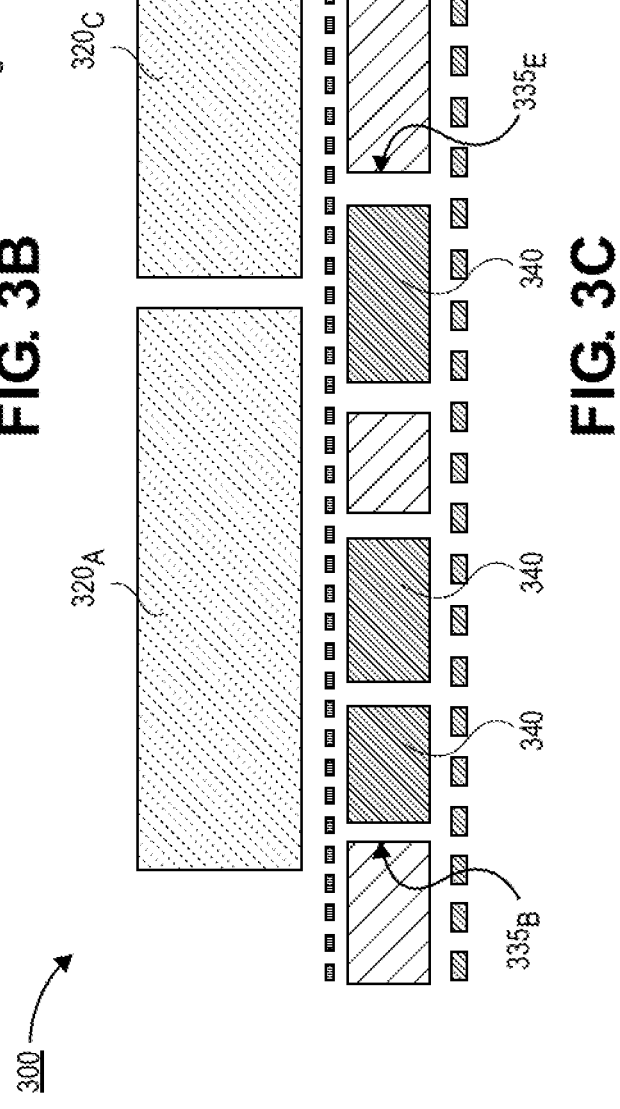
FIG. 3C is a cross-sectional illustration of the electronic package in FIG. 3A along line C-C', in accordance with an embodiment.

Referring now to FIG. 3C, a cross-sectional schematic illustration of the electronic package 300 in FIG. 3A along line C-C' is shown, in accordance with an embodiment. In the illustrated embodiment, the interposer 330 is shown with nested components 340 within cavities 335B and 335E. The interposer 330 and the nested components 340 may be electrically coupled to the dies 320A and 320B by interconnects that comprise a layer of bump pads 384. The bump pads 384 are shown schematically between the dies 320A, 320B and the interposer 330 and the nested components 340 for simplicity. However, it is to be appreciated that the bump pads 384 may be part of an interconnect substantially similar to the interconnects 181 and 182 described above with respect to FIG. 1B. In an embodiment, the bottom surfaces of the interposer 330 and the nested components 340 may be electrically coupled to package side bumps 337.

Figure 4:
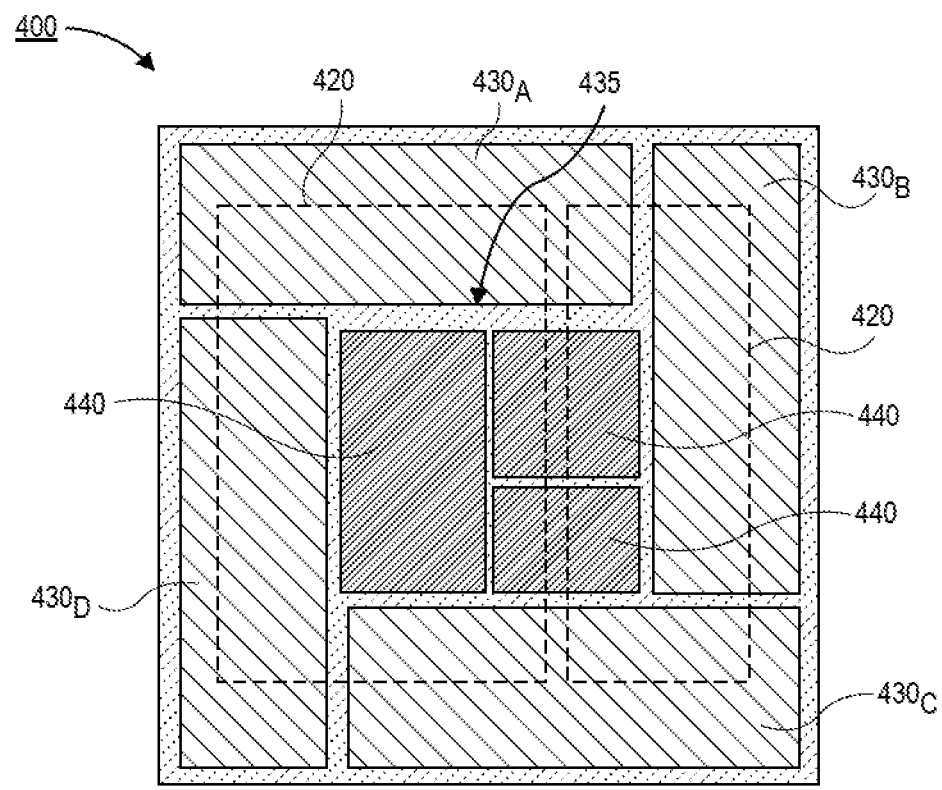
FIG. 4 is a plan view illustration of an electronic package with a heterogeneous nested interposer that comprises a plurality of interposer substrates, in accordance with an embodiment.

Referring now to FIG. 4, a plan view illustration of an electronic package 400 is shown, in accordance with an embodiment. In an embodiment, the electronic package 400 may comprise a plurality of interposers 430A-D. Each interposer 430 may be any shape. For example, the interposers 430 are illustrated as being rectilinear. The interposers 430 may be arranged so that sidewalls of the interposers 430 define a cavity 435. In an embodiment, one or more nested components 440 may be positioned in the cavity 435. In an embodiment, one or more dies 420 (indicated with dashed lines) may be provided above the interposers 430 and the nested components 440. Each of the dies 420 may extend over one or more of interposers 430.

In an embodiment, each of the interposers 430 may be substantially similar to each other. For example, each of the interposers 430 may be passive interposers 430 or active interposers 430. In other embodiments, the interposers 430 may not all be the same. For example, one or more of the interposers 430 may be an active interposer 430 and one or more of the interposers 430 may be passive interposers.

Referring now to FIGS. 5A-5M, a series of cross-sectional illustrations depicting a process for forming an electronic package with a heterogeneous nested interposer is shown, in accordance with an embodiment.

Referring now to FIG. 5A, a cross-sectional illustration of a first carrier 591 with bumps 585 is shown, in accordance with an embodiment. In an embodiment, the first carrier 591 may be any suitable carrier substrate, such as glass or the like. In an embodiment, a conductive layer 512 may be adhered to the first carrier 591 with an adhesive 511. A plurality of bump pads 584 may be formed over the conductive layer 512. For example, the bump pads 584 may be formed with a lithographically defined resist layer (not shown) and a plating process (e.g., electroplating). Accordingly, the alignment of bump pads 584 relative to each other will be excellent since they are formed with a single patterning process. In an embodiment, the bump pads 584 may include bump pads 584 of different sizes in order to accommodate different features. For example, larger bump pads 584 may accommodate the interposer and smaller bump pads 584 may accommodate the nested components. In an embodiment, a bump 585 may be disposed over the top surfaces of each of the bump pads 584. For example, the bumps 585 may be solder bumps or the like.

Referring now to FIG. 5B, a cross-sectional illustration after the interposer 530 and the nested component 540 is attached to the bump pads 584 is shown, in accordance with an embodiment. In an embodiment, the interposer 530 may comprise vias 534 that connect pads 533 on a first surface of the interposer 530 to pads 536 on a second surface of the interposer 530. In an embodiment, the nested component 540 may be positioned within a cavity 535 of the interposer. In an embodiment, the nested component 540 may have an active surface 541 and through component vias 544. In the illustrated embodiment, the active surface 541 is facing the first carrier 591. However, it is to be appreciate that in other embodiments, the active surface 541 may be facing away from the first carrier 591. In other embodiments, the nested component 540 may not have through component vias 544. The nested component may have pads 543 on a first surface and pads 546 on a second surface.

In an embodiment, the pads 546 of the nested component 540 and the pads 536 of the interposer 530 may be electrically coupled to the bump pads 584. Since the pads 546 and 536 are coupled to the bump pads 584 by bumps 585, they are self-aligned to the bump pads 584. Accordingly, the alignment between the nested component 540 and the interposer 530 have excellent alignment with each other. In an embodiment, the nested component 540 may be attached first followed by attaching the interposer 530, or the interposer 530 may be attached first followed by attaching the nested component 540.

In the illustrated embodiment, a single interposer 530 and nested component 540 are shown on the first carrier 591. However, it is to be appreciated that the first carrier 591 may be a panel level, sub-panel level, wafer-level, etc. carrier on which a plurality of electronic packages are fabricated substantially in parallel.

Referring now to FIG. 5C, a cross-sectional illustration after an underfill material 531 is dispensed around the interposer 530 and the nested component 540 is shown, in accordance with an embodiment. The underfill material 531 may be dispensed with any suitable process.

Figure 5D:
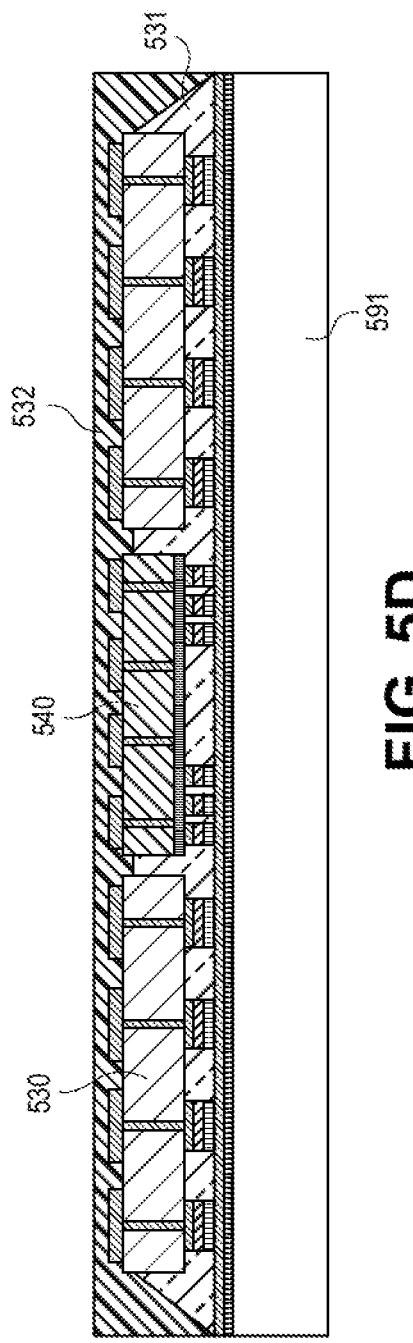
FIG. 5D is a cross-sectional illustration after a mold layer is disposed over the interposer and the nested component, in accordance with an embodiment.

Referring now to FIG. 5D, a cross-sectional illustration after a mold layer 532 is applied over the nested component 540 and the interposer 530 is shown, in accordance with an embodiment. Accordingly, the nested component 540 and the interposer 530 may be substantially embedded by the combination of the underfill material 531 and the mold layer 532. The mold layer 532 may be a build-up film, a solder resist laminated layer, or a molding compound. In some embodiments, the mold layer 532 may be planarized (e.g., with a chemical mechanical polishing (CMP) process). In an embodiment, the mold layer 532 may be a different material than the underfill material 531. Accordingly, in some embodiments, a seam between the underfill material 531 and the mold layer 532 may be visible.

Figure 5E:
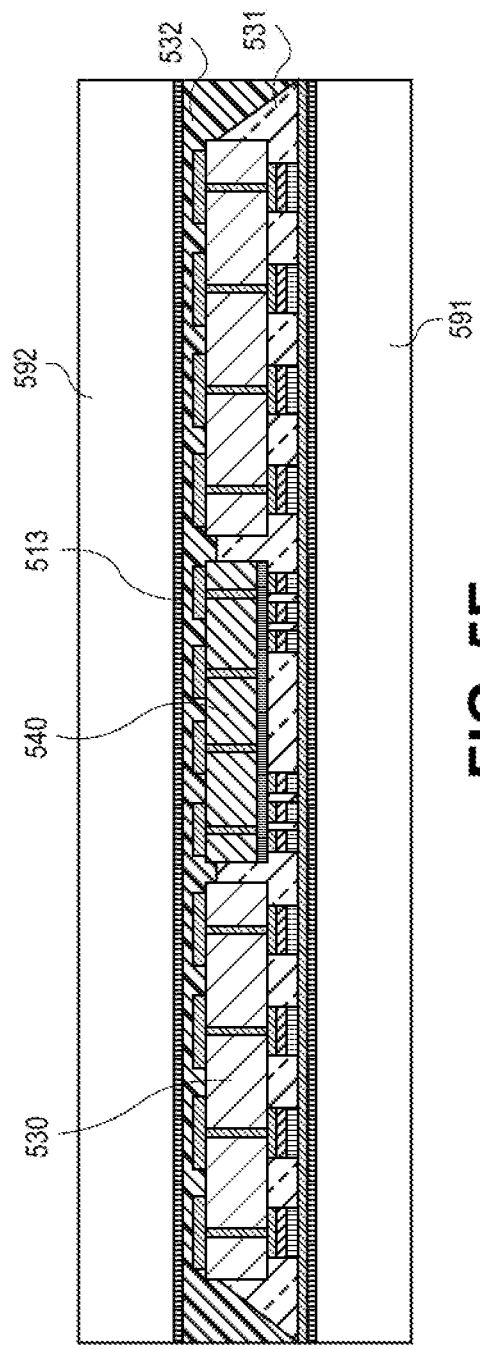
FIG. 5E is a cross-sectional illustration after a second carrier is attached to the mold layer, in accordance with an embodiment.

Referring now to FIG. 5E, a cross-sectional illustration after a second carrier 592 is attached to the mold layer 532 is shown, in accordance with an embodiment. In an embodiment, the second carrier 592 may be attached to the mold layer 532 with an adhesive 513 or the like. The second carrier 592 may be a glass carrier or any other suitable carrier substrate.

Referring now to FIG. 5F, a cross-sectional illustration after the first carrier 591 is removed is shown, in accordance with an embodiment. As shown, the removal of the first carrier 591 and the adhesive 511 results in the conductive layer 512 being exposed.

Referring now to FIG. 5G, a cross-sectional illustration after the conductive layer 512 is removed is shown, in accordance with an embodiment. In an embodiment, the conductive layer 512 may be removed with grinding process, an etching process, or any other suitable process. Removal of the conductive layer 512 exposes surfaces of the bump pads 584.

Figure 5H:
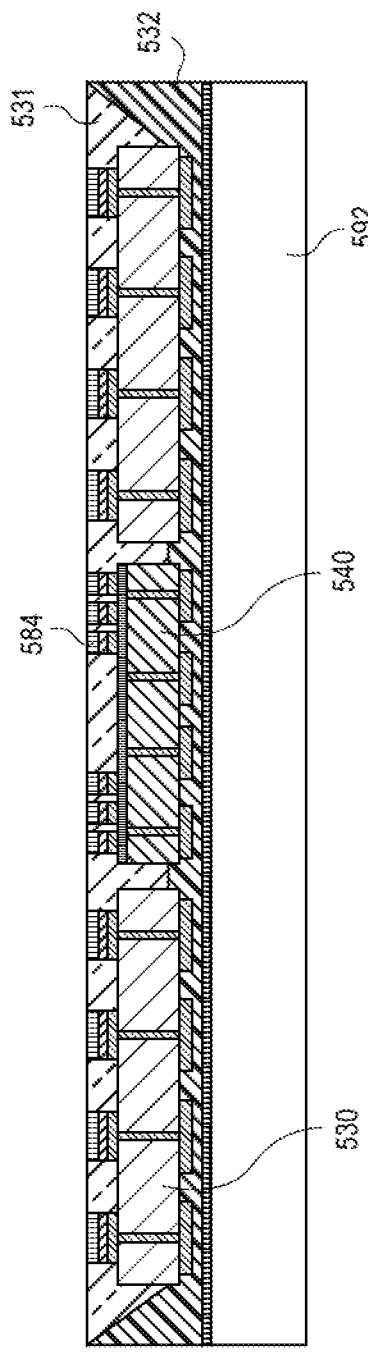
FIG. 5H is a cross-sectional illustration after the structure is flipped over so that the bump pads are facing upwards, in accordance with an embodiment.

Referring now to FIG. 5H, a cross-sectional illustration after the assembly is flipped over is shown, in accordance with an embodiment. At this point, the bump pads 584 are oriented so that the exposed surfaces are facing upwards.

Figure 5I:
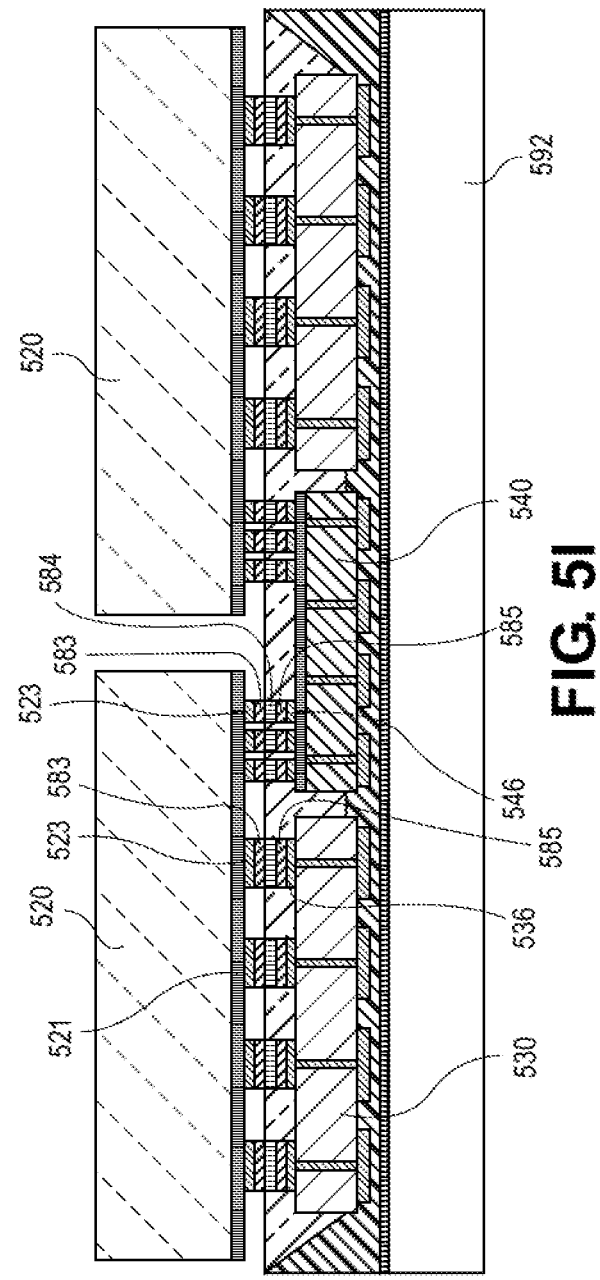
FIG. 5I is a cross-sectional illustration after dies are attached to the bump pads, in accordance with an embodiment.

Referring now to FIG. 5I, a cross-sectional illustration after dies 520 are attached to the interposer 530 and the nested component 540 is shown, in accordance with an embodiment. In an embodiment, the dies 520 comprise an active surface 521 that faces towards the bump pads 584. In an embodiment, the nested component 540 may be a bridge that electrically couples the dies 520 together.

In an embodiment, the dies 520 may be electrically coupled to the bump pads 584 by bumps 583. For example, the bumps 583 may be solder bumps. As shown, opposing surfaces of the bump pads 584 are covered by bumps 583, 585. This provides an interconnects between the die 520 and the interposer 530 that comprise a pad 523, a bump 583, a bump pad 584, a bump 585, and a pad 536, and provides interconnects between the die 520 and the nested component 540 that comprise a pad 523, a bump 583, a bump pad 584, a bump 585, and a pad 546. Since solder bumps are used, the dies 520 are self-aligned to the bump pads 584. Accordingly, the dies 520, the interposer 530, and the nested component 540 are all self-aligned to a single feature (i.e., the bump pads 584). This provides excellent alignment between the dies 520 and the interposer 530 and the nested component 540.

Referring now to FIG. 5J, a cross-sectional illustration after a mold layer 522 is disposed over the dies 520 is shown, in accordance with an embodiment. In an embodiment, the mold layer 522 may be also comprise an underfill material (not shown). In an embodiment, the mold layer 522 may be recessed (e.g., with a CMP process or the like) to expose backside surfaces of the dies 520.

Referring now to FIG. 5K, a cross-sectional illustration after the second carrier 592 is removed is shown, in accordance with an embodiment. In an embodiment, removal of the second carrier 592 exposes portions of the mold layer 532 on the package side of the assembly.

Referring now to FIG. 5L, a cross-sectional illustration after openings 596 are formed into the mold layer 532 to expose package side pads 533 and 543 of the interposer 530 and the nested component 540, respectively, is shown, in accordance with an embodiment. In an embodiment, the openings 596 may be formed with a laser drilling process or a lithography process.

Referring now to FIG. 5M, a cross-sectional illustration after bumps 537 are disposed in the openings 596 is shown, in accordance with an embodiment. The bumps 537 may be referred to as package side bumps (PSBs) since they will interface with a package substrate (not shown). However, it is to be appreciated that other interconnect architectures (e.g., LGA, PGA, PoINT, eWLB, or the like) may be used instead of the bumps 537 in the BGA architecture shown. In an embodiment, the individual electronic packages may be singulated from the panel-level assembly after (or before) the formation of the PSBs 537.

Figure 6:
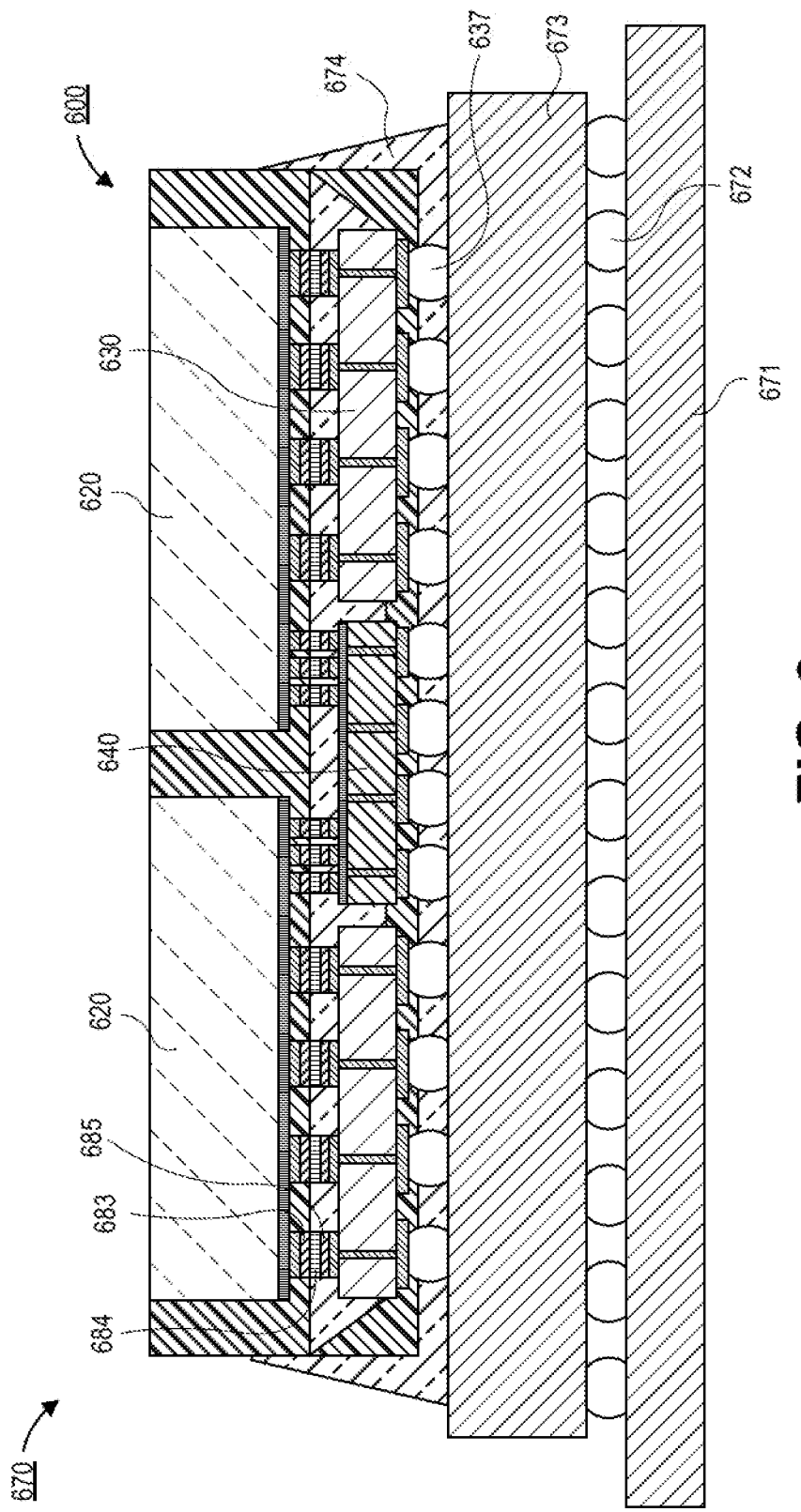
FIG. 6 is a cross-sectional illustration of an electronic system that comprises a heterogeneous nested interposer, in accordance with an embodiment.

Referring now to FIG. 6, a cross-sectional illustration of an electronic system 670 is shown, in accordance with an embodiment. In an embodiment, the electronic system 670 may comprise a board 671 (e.g. a printed circuit board (PCB)) that is coupled to a package substrate 673 by interconnects 672. The interconnects 672 are shown as being solder bumps. However, it is to be appreciated that any interconnect architecture may be used. In an embodiment, the electronic system 670 may comprise an electronic package 600 that is coupled to the package substrate 673 with package side bumps 637.

The electronic package 600 may be substantially similar to the electronic packages described above. For example, the electronic package may comprise an interposer 630 and one or more nested components 640. One or more dies 620 may be electrically coupled to the interposer 630 and the nested component 640 by interconnects that comprise a bump pad 684 with bumps 683, 685 on opposing surfaces. In an embodiment, an underfill material 674 may surround the package side bumps 637.

Figure 7:
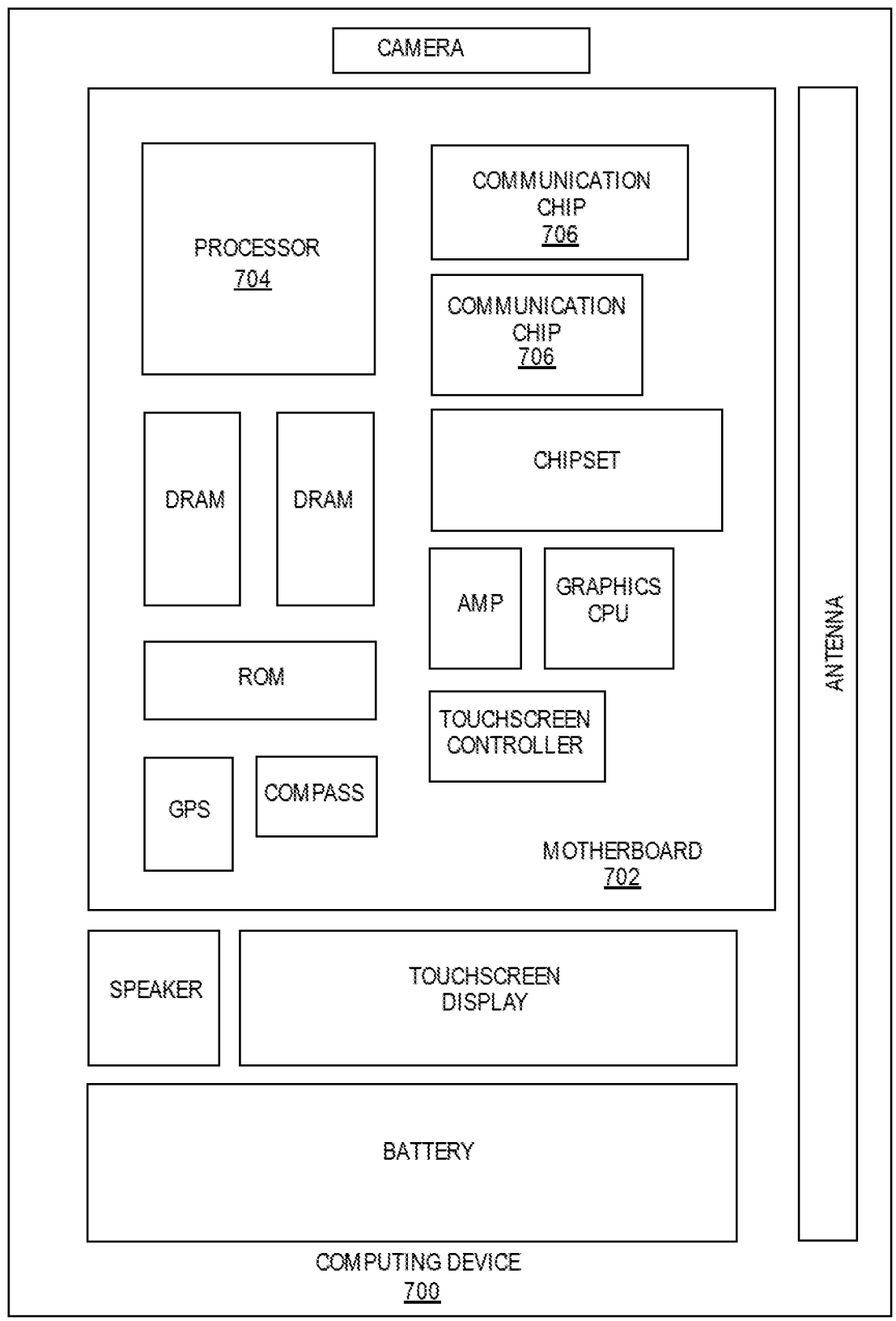
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged in an electronic system that comprises a multi-chip package with an interposer and a nested component that are coupled to one or more dies by interconnects that comprises a bump pad with bumps on opposing surfaces of the bump pad, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged in an electronic system that comprises a multi-chip package with an interposer and a nested component that are coupled to one or more dies by interconnects that comprises a bump pad with bumps on opposing surfaces of the bump pad, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: an interposer, wherein a cavity passes through the interposer; a nested component in the cavity; and a die coupled to the interposer by a first interconnect and coupled to the nested component by a second interconnect, wherein the first and second interconnects comprise: a first bump; a bump pad over the first bump; and a second bump over the bump pad.

Example 2: the electronic package of Example 1, wherein the bump pad of the first interconnect is substantially coplanar to the bump pad of the second interconnect.

Example 3: the electronic package of Example 1 or Example 2, wherein the nested component and the interposer are embedded in an underfill layer and a first mold layer.

Example 4: the electronic package of Example 3, wherein the die is embedded in a second mold layer.

Example 5: the electronic package of Examples 1-4, wherein the cavity is entirely within a footprint of the die.

Example 6: the electronic package of Examples 1-4, wherein a first portion of the cavity is within a footprint of the die, and wherein a second portion of the cavity is outside of the footprint of the die.

Example 7: the electronic package of Examples 1-6, wherein through component vias extend through the nested component.

Example 8: the electronic package of Examples 1-7, wherein the nested component is a passive component.

Example 9: the electronic package of Examples 1-7, wherein the nested component is an active component.

Example 10: the electronic package of Examples 1-9, further comprising: a second die, wherein the second die is coupled to the nested component by a third interconnect comprising: a first bump; a bump pad over the first bump; and a second bump over the bump pad.

Example 11: the electronic package of Example 10, wherein the nested component electrically couples the first die to the second die.

Example 12: the electronic package of Examples 1-11, further comprising:
a second nested component in the cavity.

Example 13: the electronic package of Examples 1-12, wherein an active surface of the nested component faces away from the die.

Example 14: the electronic package of Examples 1-13, wherein the nested component comprises a plurality of stacked dies.

Example 15: the electronic package of Examples 1-14, wherein the interposer comprises a plurality of discrete interposer substrates, wherein edges of the plurality of discrete interposer substrates define the cavity.

Example 16: the electronic package of Examples 1-15, wherein the interposer comprises glass, ceramic, silicon, or organic materials.

Example 17: the electronic package of Examples 1-16, further comprising one or more redistribution layers, wherein the one or more redistribution layers are located over a top surface of the interposer, over a bottom surface of the interposer, over a top surface of the nested component, over a bottom surface of the nested component, over a mold layer that embeds the interposer and the nested component, and/or between the first bumps and the second bumps.

Example 18: an electronic system, comprising: a board; a package substrate electrically coupled to the board; an interposer electrically coupled to the package substrate, wherein the interposer comprises a cavity; a nested component in the cavity, wherein the nested component is electrically coupled to the package substrate; a first die electrically coupled to the interposer and the nested component by interconnects; and a second die electrically coupled to the interposer and the nested component by interconnects, wherein the interconnects comprise: a first bump; a bump pad over the first bump; and a second bump over the bump pad.

Example 19: the electronic system of Example 18, wherein the nested component electrically couples the first die to the second die.

Example 20: the electronic system of Example 18 or 19, wherein the nested component is a passive component.

Example 21: the electronic system of Example 18 or 19, wherein the nested component is an active component.

Example 22: the electronic system of Examples 18-21, wherein the nested component comprises a plurality of stacked dies.

Example 23: a method of forming an electronic package, comprising: forming first bump pads and second bump pads on a first carrier, wherein first bumps are disposed over the first bump pads and the second bump pads; attaching an interposer to the first bump pads, wherein the interposer comprises a cavity; attaching a nested component to the second bump pads, wherein the nested component is within the cavity of the interposer; applying a mold layer over the interposer and the nested component; attaching a second carrier to the mold layer; removing the first carrier; exposing surfaces of the first bump pads and the second bump pads opposite from the first bumps; and attaching a die to the first bump pads and the second bump pads with second bumps.

Example 24: the method of Example 23, further comprising: applying a second mold layer over the die; and removing the second carrier.

Example 25: the method of Example 24, further comprising: attaching interconnects to the interposer and the nested component.

What is claimed is:

1. An electronic package, comprising:
    an interposer, wherein a cavity passes through the interposer;
    a nested component in the cavity; and
    a die coupled to the interposer by a first interconnect and coupled to the nested component by a second interconnect, wherein the first and second interconnects comprise:
    a first bump;
    a bump pad over the first bump; and
    a second bump over the bump pad.

2. The electronic package of claim 1, wherein the bump pad of the first interconnect is substantially coplanar to the bump pad of the second interconnect.

3. The electronic package of claim 1, wherein the nested component and the interposer are embedded in an underfill layer and a first mold layer.

4. The electronic package of claim 3, wherein the die is embedded in a second mold layer.

5. The electronic package of claim 1, wherein the cavity is entirely within a footprint of the die.

6. The electronic package of claim 1, wherein a first portion of the cavity is within a footprint of the die, and wherein a second portion of the cavity is outside of the footprint of the die.

7. The electronic package of claim 1, wherein through component vias extend through the nested component.

8. The electronic package of claim 1, wherein the nested component is a passive component.

9. The electronic package of claim 1, wherein the nested component is an active component.

10. The electronic package of claim 1, further comprising:
a second die, wherein the second die is coupled to the nested component by a third interconnect comprising:
a first bump;
a bump pad over the first bump; and
a second bump over the bump pad.

11. The electronic package of claim 10, wherein the nested component electrically couples the first die to the second die.

12. The electronic package of claim 1, further comprising:
a second nested component in the cavity.

13. The electronic package of claim 1, wherein an active surface of the nested component faces away from the die.

14. The electronic package of claim 1, wherein the nested component comprises a plurality of stacked dies.

15. The electronic package of claim 1, wherein the interposer comprises a plurality of discrete interposer substrates, wherein edges of the plurality of discrete interposer substrates define the cavity.

16. The electronic package of claim 1, wherein the interposer comprises glass, ceramic, silicon, or organic materials.

17. The electronic package of claim 1, further comprising one or more redistribution layers, wherein the one or more redistribution layers are located over a top surface of the interposer, over a bottom surface of the interposer, over a top surface of the nested component, over a bottom surface of the nested component, over a mold layer that embeds the interposer and the nested component, and/or between the first bumps and the second bumps.

18. An electronic system, comprising:
a board;
a package substrate electrically coupled to the board;
an interposer electrically coupled to the package substrate, wherein the interposer comprises a cavity;
a nested component in the cavity, wherein the nested component is electrically coupled to the package substrate;
a first die electrically coupled to the interposer and the nested component by first interconnects; and
a second die electrically coupled to the interposer and the nested component by second interconnects, wherein each of the first interconnects and each of the second interconnects:
a first bump;
a bump pad over the first bump; and
a second bump over the bump pad.

19. The electronic system of claim 18, wherein the nested component electrically couples the first die to the second die.

20. The electronic system of claim 18, wherein the nested component is a passive component.

21. The electronic system of claim 18, wherein the nested component is an active component.

22. The electronic system of claim 18, wherein the nested component comprises a plurality of stacked dies.

* * * * *